United States Patent [19]
Guarjado

[11] 3,791,025
[45] Feb. 12, 1974

[54] METHOD OF MANUFACTURING AN ELECTRONIC ASSEMBLY

[75] Inventor: Ciro Guarjado, Harbor City, Calif.
[73] Assignee: Teledyne, Inc., Los Angeles, Calif.

[22] Filed: Apr. 6, 1972
[21] Appl. No.: 241,537

[52] U.S. Cl. ........................ 29/577, 29/588, 29/627
[51] Int. Cl. ............................................. B01j 17/00
[58] Field of Search ........... 29/576 S, 588, 627, 577

[56] References Cited

UNITED STATES PATENTS

| | | | |
|---|---|---|---|
| 3,271,625 | 9/1966 | Caracciolo | 29/576 S |
| 3,325,586 | 6/1967 | Suddick | 29/576 S |
| 3,544,857 | 12/1970 | Byrne et al. | 29/576 S |

*Primary Examiner*—W. C. Tupman
*Attorney, Agent, or Firm*—Ronald W. Reagin

[57] ABSTRACT

A method of manufacturing and packaging an electrical circuit formed from discrete components is disclosed in which the final package is a dual in-line package. The components are mounted on a lead frame which includes an external support frame, a central portion including a plurality of discrete regions each corresponding to a respective one of the nodes in the circuit, and a plurality of leg members extending from the central portion to the support frame. Each of the discrete regions has no contact within the central portion with any of the other discrete regions. A respective one of the leg members corresponding to each external node in the circuit and is connected to the discrete region in the central portion corresponding to its external node. A body of insulative material is then formed around the central portion of the lead frame and the components, and the excess external portions of the lead frame are then removed.

3 Claims, 5 Drawing Figures

METHOD OF MANUFACTURING AN ELECTRONIC ASSEMBLY

This invention relates to electronic packaging techniques, and more particularly to an improved method for manufacturing a dual in-line package assembly in which the circuit can be formed from discrete electrical components.

It is a common practice in the electronic art to package integrated circuit chips and the like in a format which is known to those skilled in the art as the dual in-line package, or a DIP package assembly. In the DIP package, the integrated circuit chip is positioned within a dielectric body formed from a suitable insulative plastic material or the like and the leads for the integrated circuit are brought out through legs extending from opposed sides of the dielectric body. The common method of manufacturing such DIP packages is to provide a symmetrical lead frame which includes a central island which supports the integrated circuit chip and which has a plurality of arms extending radially inwardly towards the island which supports the chip. These radially inwardly extending arms are each connected to a respective one of the legs extending outwardly from opposed side of the lead frame. The integrated circuit chip is secured to the central island and the lead wires of the chip are each connected to a respective one of the radial arms. The dielectric material is then molded around the lead frame. The excess portions of the lead frame are cut away and the legs bent downward so that the entire DIP package can then be mounted in a mating female socket.

The advantages of a DIP package are such that it would be desirable to be able to package more conventional electrical circuits formed from discrete components in this manner, as well as merely packaging integrated circuit chips in this manner. However, when those skilled in the art have attempted to adapt the DIP package technique to conventional circuits, a number of problems have been encountered. For example, the lead frame technique, while quite satisfactory for mounting a single component having a large number of leads thereto, such as an integrated circuit chip, did not readily lend itself to use with more conventional circuits formed from conventional discrete components, since most circuits cannot conveniently be laid out in a radial manner.

One technique which has met with limited success in the prior art is to form the circuit from the discrete components on a small printed circuit board, using conventional printed circuit techniques. The printed circuit board and a lead frame consisting only of the outwardly extending legs is then positioned in a satisfactory mold and the dielectric body is molded around the printed circuit board and the legs. Thereafter, the external excess portions of the lead frame are cut away and the legs are bent downward in a conventional manner. While this was a technically satisfactory solution to the problem, the economic drawbacks of this method are obvious. It requires the additional cost and steps of forming the printed circuit board and mounting the components on the board.

It is accordingly an object of the present invention to provide an improved method of manufacturing an electronic assembly.

It is another object of the present invention to provide an improved method of manufacturing a DIP package electronic assembly in which the circuit is formed from discrete electrical components in any desired configuration or connection and which uses an inexpensive lead frame configuration to support and interconnect these components.

Briefly stated, and in accordance with the presently preferred embodiment of the invention, a method of manufacturing an electronic assembly is provided in which the circuit is formed from a plurality of discrete components whose terminals are electrically interconnected to provide a predetermined circuit having a plurality of nodes therein. Some of these nodes are external nodes to which external electrical connections are to be made, and some of the nodes are internal nodes to which no additional electrical connection is to be made. The first step in the method is to form a lead frame from conductive material which includes an external support frame, a central portion which includes a plurality of discrete regions each corresponding to a respective one of the nodes in the circuit, with each of these discrete regions having no contact within the central portion with any of the other discrete regions, and first and second opposed sets of leg members extending from the central portion to the support frame. A respective one of the leg members corresponds to each of the external nodes in the circuit and is connected to the discrete region in the central portion corresponding to its external node. Next, the components of the circuit are secured to the central portion of the lead frame and the terminals of the components are electrically connected to the discrete region corresponding to the particular node to which each terminal is to be connected. A body of insulative material is then formed around the central portion of the lead frame and the components mounted therein. The external excess portions of the lead frame are then removed, leaving only those leg members which correspond to the external nodes in the circuit.

For a complete understanding of the invention, and an appreciation of its other objects and advantages, please refer to the following detailed description of the attached drawings, in which.

Figure 1:
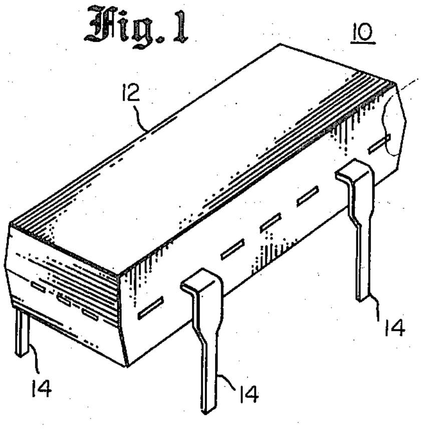
FIG. 1 shows a perspective view of a conventional dual in-line package assembly which is to be formed by the method of the present invention.

FIG. 1 shows perspective a perspective view of a dual in-line package electronic assembly 10 of a conventional nature which may be produced in accordance with the method of the present invention. The DIP assembly 10 includes a dielectric body 12, which may be made from any suitable insulative material such as a thermoplastic or the like, which encapsulates the electronic circuit or components within the DIP package 10. A plurality of legs 14 extend from opposed side of the body 12 and serve both to make electrical connection to the circuit encapsulated within the body 12 and also to mount the assembly 10 in a mating female socket (not shown).

Figure 2:
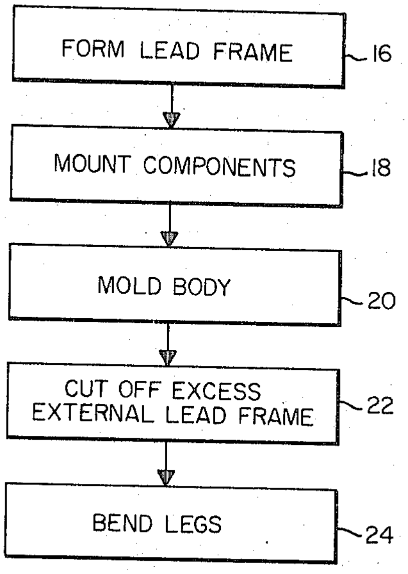
FIG. 2 shows a block flow diagram of the steps of the method of the present invention.

FIG. 2 shows a block flow diagram of the method of the present invention by which the assembly 10 of FIG. 1 can be manufactured to enclose a circuit form from discrete electronic components. As is shown schematically in FIG. 2, the steps of the method are as follows: First a lead frame is formed which has a particular configuration which is described in detail in connection with the description of FIGS. 4 and 5 below. Next, the components are mounted on the lead frame and the proper electrical connections are made. Next, the lead frame, with the mounted components on it, is placed in a suitable mold or the like and the dielectric body 12 is molded around the lead frame. Next, the excess external portions of the lead frame are cut off flush with the surface of the body 12 to leave only the desired legs 14 projecting outwardly from the body 12. Finally, the legs are bent downwardly to complete the assembly 10 of FIG. 1.

Figure 3:
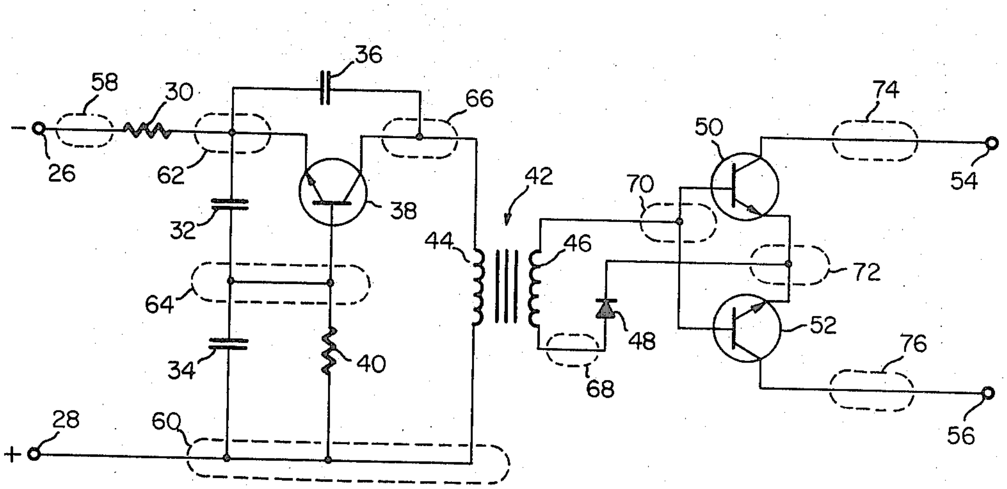
FIG. 3 shows a circuit diagram of a representative circuit which might be packaged in a DIP assembly in accordance with the method of the present invention.

FIG. 3 shows a circuit diagram of a typical circuit which might be formed from discrete electronic components and which is to be mounted in a DIP package 10 as is shown in FIG. 1. It is emphasized that the circuit of FIG. 3 is illustrative only, and itself forms no part of the present invention. It is disclosed merely to explain the nature of the method of the present invention.

Reading from left to right, the circuit of FIG. 3, includes input terminals 26 and 28, a resistance 30, capacitors 32, 34 and 36, a transistor 38, a resistance 40, a transformer 42 having a primary winding 44 and a secondary winding 46, a diode 48, transistors 50 and 52 and output terminals 54 and 56. Although, as was mentioned above, the circuit itself forms no part in the present invention, the particular disclosed circuit is a relay circuit which, in the absence of an input signal applied to input terminals 26 and 28, presents a high impedance between output terminals 54 and 56 and upon the application of a potential to terminal 28 positive relative to terminal 26 presents a low impedance between output terminals 54 and 56. No further description of the operation or the function of the circuit is given herein.

Using conventional circuit analysis, the circuit of FIG. 3 is seen to contain ten nodes or nodal points. The node 58 is the junction between input terminal 26 and resistance 30. The node 60 is the junction between input terminal 28, capacitor 34, resistance 40 and primary winding 44 of transformer 42. The node 62 is the junction between resistance 30, capacitor 32, capacitor 36 and the emitter electrode of transistor 38. Node 64 is the junction between capacitor 32, capacitor 34, the base electrode of transistor 38 and resistance 40. The node 66 is the junction between capacitor 36, the collector electrode of transistor 38 and the primary winding 44 of transformer 42. Node 68 is the junction between the secondary winding 46 of transformer 42 and the anode of diode 48. Node 70 is the junction between secondary winding 46 of transformer 42 and the base electrodes of transistors 50 and 52. Node 72 is the junction between the cathode of diode 48 and the emitter electrodes of transistors 50 and 52. Node 74 is the junction between the collector electrode of transistor 50 and the output terminal 54. Node 76 is the junction between the collector electrode of transistor 52 and the output terminal 56.

Of these ten nodes, four require electrical connection to a source or point external to the circuit, these being the nodes 58, 60, 74 and 76. These nodes may be termed the external nodes of the circuit. Similarly, the remaining six nodes, nodes 62, 64, 66, 68, 70 and 72 require no external electrical connections and may be termed the internal nodes of the circuit.

Figure 4:
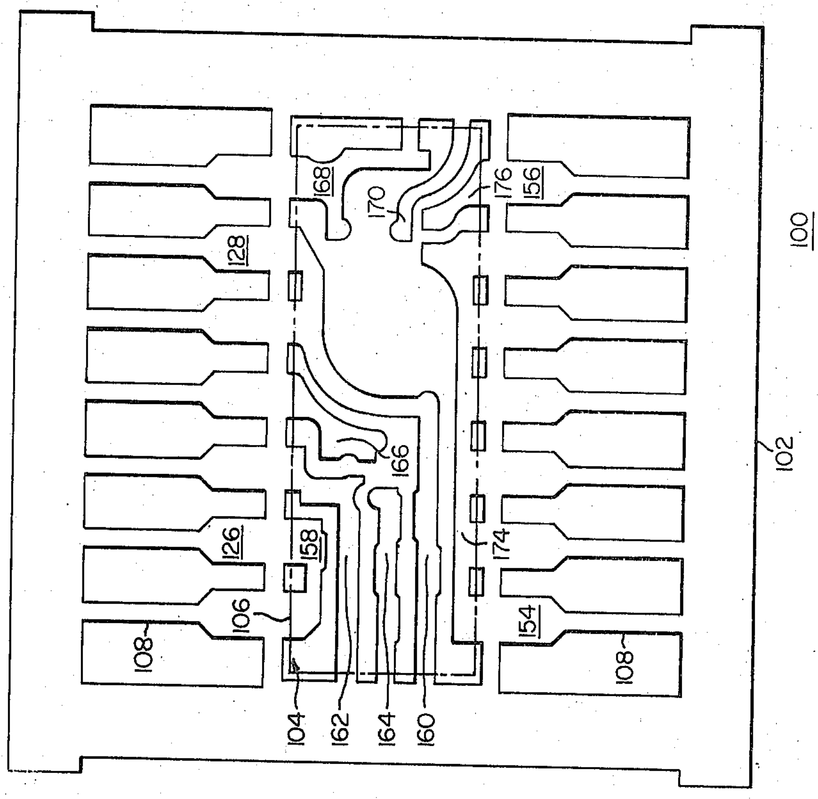
FIG. 4 shows a plan view of a lead frame for use in the method of the present invention to form the particular circuit shown in FIG. 3.

FIG. 4 shows a plan view of lead frame 100 which can cheaply and inexpensively be stamped out of a sheet of conductive material and which can be used to support and complete the circuit of FIG. 3 and enable it to be conveniently and economically manufactured into a DIP package. The lead frame 100 includes an external support frame 102 which extends completely around the lead frame, a central portion 104 (bounded by the broken line 106) and a plurality of leg members 108 which extend outwardly on opposite sides of the central portion 104 to the support frame 102.

Within the central portion 104 are a plurality of discrete regions each corresponding to a respective one of the nodes in the circuit of FIG. 3. Each of these discrete regions has no contact with the central portion 104 with any of the other discrete regions in central portion 104.

The discrete regions in the central portion 104 of lead frame 100 bear the following relation to the nodes of the circuit of FIG. 3. The region 158 corresponds to the node 58, the region 160 corresponds to the node 60, the region 162 corresponds to the node 62, the region 164 corresponds to the node 64, the region 166 corresponds to the node 66, the region 168 corresponds to the node 68, the region 170 corresponds to the node 70, the region 174 corresponds to the node 74 and the region 176 corresponds to the node 76. For the reasons described below in the description of FIG. 5, there is no discrete region corresponding to the node 72. Similarly, the legs 126 and 128 of the lead frame 100 correspond to the input terminal 26 and 28 respectively and the legs 154 and 156 correspond to the output terminals 54 and 56. Each of these legs is in electrical contact with its corresponding external node at at least one point within the central portion 104 of lead frame 100.

Figure 5:
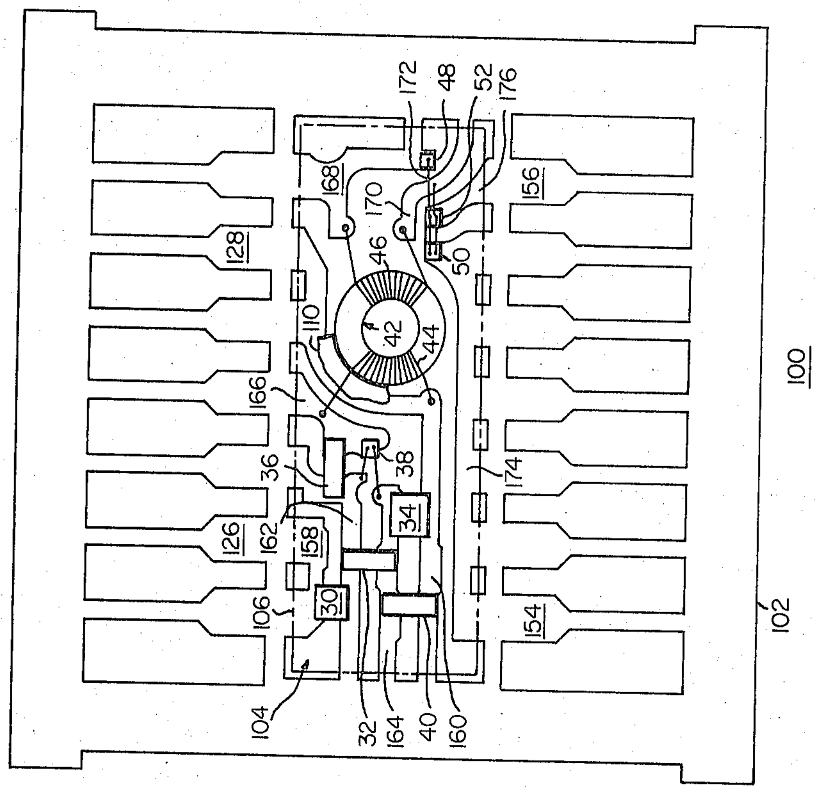
FIG. 5 is a view similar to FIG. 4 but shows the components mounted on the lead frame.

FIG. 5 is a view similar to FIG. 4 but shows the components mounted on the lead frame 100 to form the circuit shown in the circuit diagram of FIG. 3. As is shown in FIG. 5, a resistance 30 is mounted with its ends secured mechanically and electrically to the regions 158 and 162. For example, the resistance 30 could be welded at each end of these regions. Similarly, a capacitor 32 is mounted between regions 162 and 164, a capacitor 34 is mounted between regions 164 and 160, a capacitor 36 is mounted between regions 162 and 166, and a resistance 40 is mounted between regions 160 and 164. A transistor 38, which has its collector electrode electrically connected to its case, is welded to the region 166 while the lead wire from its emitter electrode is welded to the region 162 and the lead wire from its base electrode is welded to the region 164.

The transformer 42 is mechanically secured to the lead frame in any convenient manner, such as by the epoxy adhesive 110 securing it to the region 160. The lead wires of its primary winding 44 are respectively welded to the regions 160 and 166 while the lead wires from its secondary winding 46 are respectively welded to the regions 168 and 170.

A diode 48, which has its anode electrode connected to its housing, is welded to the region 168 and transistors 50 and 52, which have their collector electrodes connected to their housings, are respectively welded to regions 174 and 176. The base electrode lead wires of transistors 50 and 52 are connected to each other and to the region 170 by a suitable lead wire, thereby completing the electrical connection between these elements and the secondary winding 46 of transformer 42. The emitter electrodes of transistors 50 and 52 are connected to the cathode of diode 48 by the wire 172. This wire 172 thus becomes the node 72 of FIG. 3.

It is noted that an additional discrete region within the central portion 104 could have been provided for this node 72 if desired, but this particular node is illustrated in this manner to show that in some instances, in accordance with the present invention, a lead wire may be used instead of a discrete region. A lead wire node is particularly useful for a node whose only connections thereto are lead wires of transistors, diodes or the like.

After the components are mounted in the manner shown in FIG. 5, the entire lead frame assembly is placed in a suitable mold and the dielectric body 12 is molded around the central portion of the lead frame and around the components, such as by injection molding or the like. The dielectric body 12 (not shown in FIG. 5 but shown in FIG. 1) has an external surface corresponding to the broken line 106.

Next, all of the excess external portion of the lead frame is cut away, leaving only the legs 126, 128, 154 and 156. Finally, the legs are bent downwardly to enable the completed DIP package assembly to be easily mounted in a corresponding female socket. These cutting and bending steps are effected in the same manner as in the prior art DIP packages used with integrated circuits, so no details of these steps need be given herein.

Thus, in the manner just described, a circuit formed from discrete electrical components can be cheaply and easily manufactured which is packaged in the efficient and desirable DIP package. It is noted that if the resultant package were cut open along a horizontal plane, the resultant circuit would look much like a conventional printed circuit. This similarity to the printed circuit is advantageous in that it enables those skilled in the art to easily design the necessary lead frame for any particular circuit which is desired to be manufactured. Using the techniques well known to those skilled in the art, the layout of the discrete regions in the central portion 104 is easily determined in the same manner that the art work in the conventional printed circuit is determined. Thus, while the invention is disclosed and described in connection with only one circuit, those skilled in the art will have no difficulty in determining the proper layout for lead frames for other and different circuits.

While the invention is thus disclosed and a particular embodiment described in detail, it is not intended that the invention be limited to this shown embodiment. Instead, many modifications will occur to those skilled in the art which lie within the spirit and scope of the invention. It is intended that the invention be limited in scope only by the appended claims.

What is claimed is:

1. A method of manufacturing an electronic assembly which includes a circuit formed from a plurality of discrete components whose terminals are each electrically interconnected to a predetermined one of a plurality of nodes therein, some of which are external nodes to which external electrical connections can be made and some of which are internal nodes to which no additional electrical connection is to be made, said method comprising the steps of:

forming a lead frame from conductive material into a shape which includes an external support frame, a central portion including a plurality of discrete regions each corresponding to a respective one of said nodes in said circuit and each having no contact within said central portion with any of the other of said discrete regions, and a plurality of leg members extending from said central portion to said support frame, with a respective one of said leg members corresponding to each of said external nodes in said circuit and being connected to the discrete region in said central portion corresponding to its external node, mechanically securing said components to said central portion of said lead frame, electrically connecting each of the terminals of said components to the discrete region corresponding to its predetermined node, forming a body of insulative material around said central portion of said lead frame and said components, and removing those portions of said lead frame which are external to said insulative body except for said leg members which corresponds to said external nodes.

2. The method of claim 1 in which said insulative body is molded around said central portion of said lead frame and said components.

3. The method of claim 2 in which the external portions of said lead frame are removed by being cut away along the surface of said insulative body.

* * * * *